United States Patent [19]

Gruber

[11] Patent Number: 5,673,846
[45] Date of Patent: Oct. 7, 1997

[54] SOLDER ANCHOR DECAL AND METHOD

[75] Inventor: Peter Alfred Gruber, Mohegan Lake, N.Y.

[73] Assignee: International Business Machines Corporation, Armonk, N.Y.

[21] Appl. No.: 518,736

[22] Filed: Aug. 24, 1995

[51] Int. Cl.⁶ .................... H05K 3/34; B23K 35/14
[52] U.S. Cl. .................... 228/180.22; 228/254; 228/56.3; 164/113
[58] Field of Search .................... 164/113, 98; 228/224, 228/56.3, 180.22, 254; 264/328.8

[56] References Cited

U.S. PATENT DOCUMENTS

| | | | |
|---|---|---|---|
| 3,373,481 | 3/1968 | Lins et al. | 29/471.3 |
| 3,472,365 | 10/1969 | Tiedema | 228/254 |
| 3,517,434 | 6/1970 | Shaver | 29/502 |
| 3,744,129 | 7/1973 | Dewey, Jr. | 228/254 |
| 3,861,135 | 1/1975 | Seeger, Jr. et al. | 58/50 R |
| 3,971,610 | 7/1976 | Buchoff et al. | 339/17 R |
| 4,050,756 | 9/1977 | Moore | 339/55 M |
| 4,276,923 | 7/1981 | Mislan | 164/113 |
| 4,412,642 | 11/1983 | Fisher, Jr. | 228/173 R |
| 4,712,721 | 12/1987 | Noel et al. | 228/56.3 |
| 5,244,143 | 9/1993 | Ference et al. | 228/180.21 |
| 5,388,327 | 2/1995 | Trabucco | 228/254 |
| 5,447,264 | 9/1995 | Koopman et al. | 228/254 |
| 5,497,938 | 3/1996 | McMahon et al. | 228/254 |

OTHER PUBLICATIONS

IBM Technical Disclosure Bulletin, "Bump Tape Connector", vol. 36, No. 09B, pp. 553,554. Sep. 1993.

IBM Technical Disclosure Bulletin, "Peeling Tape Connector", vol. 37, No. 04B, pp. 117–119. Apr. 1994.

IBM Technical Disclosure Bulletin, "Solder Decal Design for Induction Heating Reflow", vol. 37, No. 08, pp. 507,508. Aug. 1994.

IBM Technical Disclosure Bulletin, "Fabrication of Electroplated Stainless Steel Based Eutectic Sn/Pb Solder Decals", vol. 37, No. 12, pp. 231,232. Dec. 1994.

*Primary Examiner*—Samuel M. Heinrich
*Attorney, Agent, or Firm*—Stephen S. Strunck; Francis L. Conte

[57] ABSTRACT

A solder decal is produced by a method wherein a decal strip having a plurality of anchor holes is aligned with a mold having a plurality of cells. Liquid solder is injected into the anchor holes and mold cells, and is then allowed to cool to solidify therein. The mold may be separated from the decal strip to form the solder decal containing solder beads each having a stem mechanically joined to the strip at respective ones of the anchor holes. Various forms of the solder decal are used for transferring the solder beads to a substrate or chip, or effecting temporary connections for conducting burn-in and testing, or accommodating thermal mismatch for example.

32 Claims, 6 Drawing Sheets

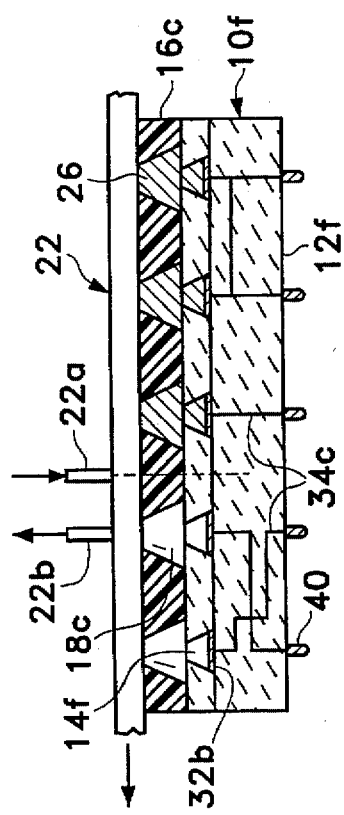
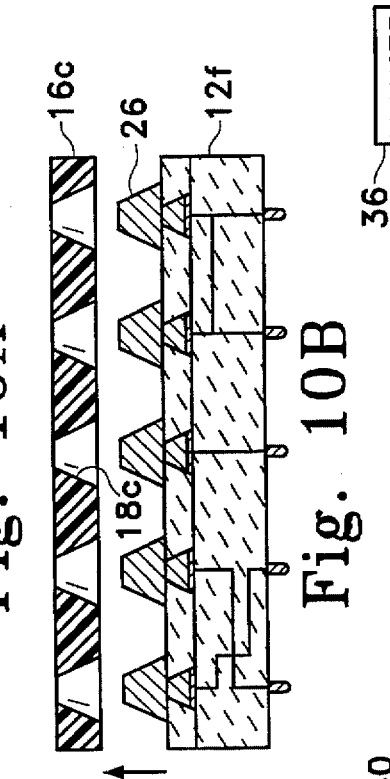
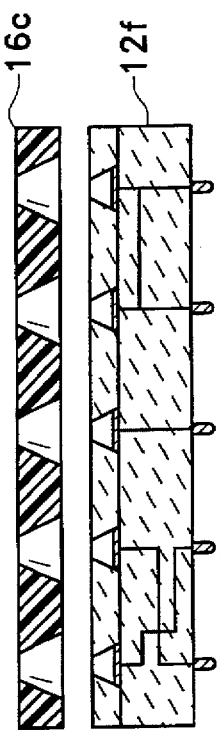
Fig. 10A
Fig. 10B
Fig. 10C
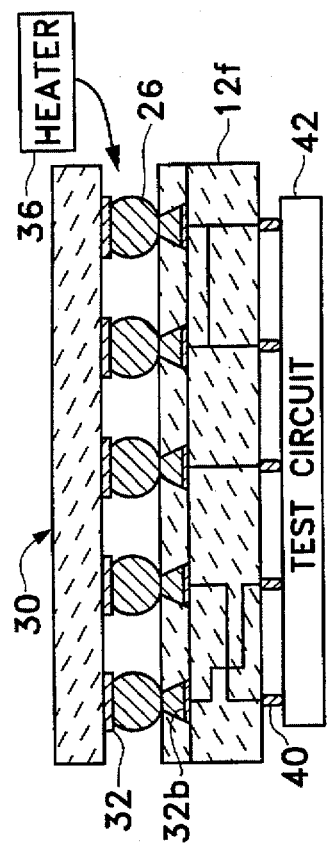
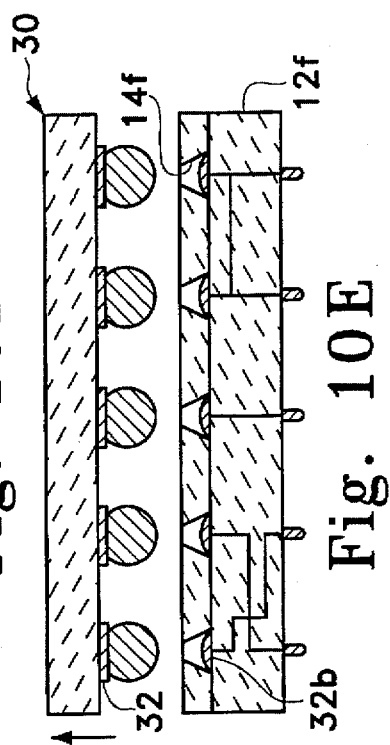
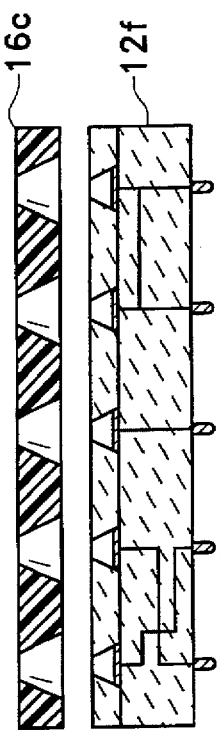
Fig. 10D
Fig. 10E
Fig. 10F

SOLDER ANCHOR DECAL AND METHOD

CROSS-REFERENCE TO RELATED APPLICATION

This application is related to commonly assigned and concurrently filed application Ser. No. 08/518,874 filed Aug. 24, 1995, entitled "Apparatus and Method for Vacuum Injection Molding."

BACKGROUND OF THE INVENTION

The present invention relates generally to soldering of integrated circuits and substrates, and, more specifically, to an improved solder decal and method of forming and using.

Solder processing for standard electronic packaging applications such as integrated circuit chip interconnections routinely use evaporation or electroplating. Both of these processes are costly, and may involve many processing steps. For example, to produce a solder decal by electroplating, a metal seed layer must first be deposited on a decal substrate. Next, this seed layer is patterned to produce the desired layout, after which the plating process produces the solder structures. Finally, the patterning and unplated seed layers must be stripped away. For effective transfer, the seed layer remaining under each solder structure must not metallurgically bond to the solder during reflow. Both of these processes are also typically limited to smaller solder structures such as solder balls having a diameter of about 2-4 mils.

Other requirements such as chip rework, burn-in and test, thermally mismatched packages, and 3-D packaging usually cannot be met with solder interconnection schemes alone. For example, burn-in and test methods usually require sophisticated temporary connectors. Thermally mismatched packages require mechanically flexible connections such as copper or gold-plated pins. The cost of these temporary connectors for burn-in and test as well as substrates with tall gold-plated pins significantly increase the overall package costs.

SUMMARY OF THE INVENTION

A solder decal is produced by a method wherein a decal strip having a plurality of anchor holes is aligned with a mold having a plurality of cells. Liquid solder is injected into the anchor holes and mold cells, and is then allowed to cool to solidify therein. The mold may be separated from the decal strip to form the solder decal containing solder beads each having a stem mechanically joined to the strip at respective ones of the anchor holes. Various forms of the solder decal are used for transferring the solder beads to a substrate or chip, or effecting temporary connections for conducting burn-in and testing, or accommodating thermal mismatch for example.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which:

FIGS. 10A–10F are a schematic representation in section of an alternate embodiment of a solder decal formed to effect a temporary electrical connection with an integrated circuit chip or substrate for allowing burn-in and testing thereof, with subsequent disassembly thereof with transfer of the solder beads to the chip or substrate.

DESCRIPTION OF THE PREFERRED EMBODIMENT(S)

Figure 1A:
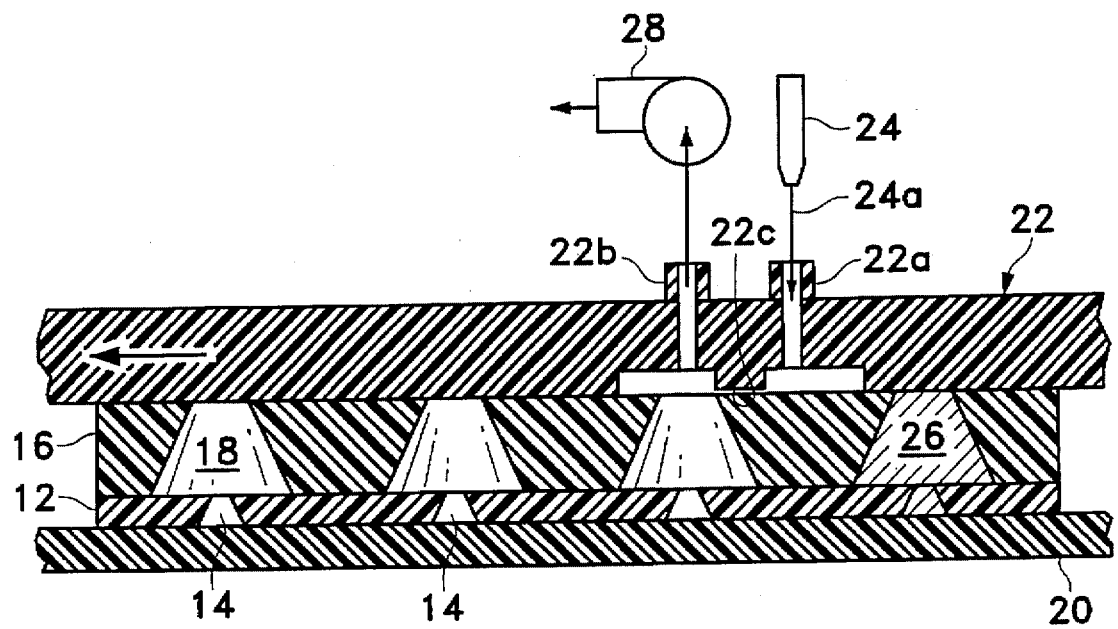
FIGS. 1A–1C are a schematic representation of a process for forming a solder decal in accordance with one embodiment of the present invention.
Figure 1B:
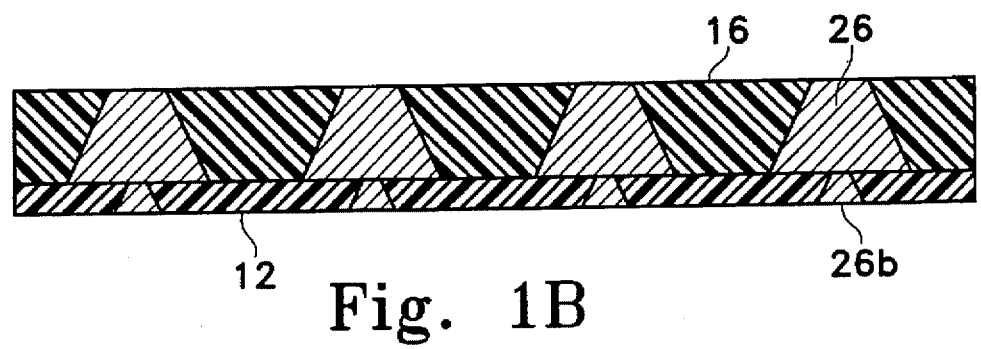
Figure 1C:
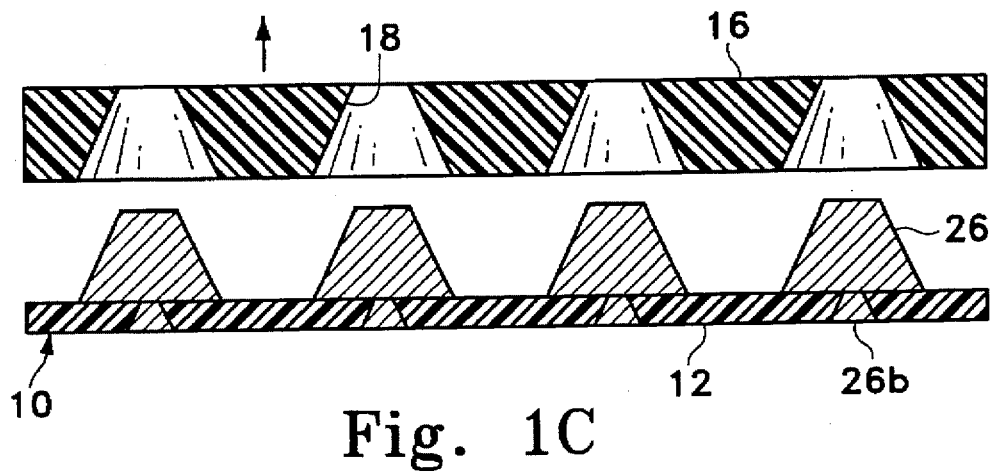

Illustrated schematically in FIGS. 1A–1C (also referred to collectively as FIG. 1) are three basic steps (a), (b), and (c), respectively, for forming or effecting an exemplary solder decal 10 in accordance with one embodiment of the present invention. The solder decal 10 includes a decal strip 12 having a plurality of initially empty anchor holes 14 therein. A mold 16 includes a plurality of mold cells or recesses 18 and is initially aligned in abutting contact with the decal strip 12 as shown in step (a) with at least one of the anchor holes 14 being aligned in flow communication with a corresponding one of the mold cells 18.

In the exemplary embodiment illustrated in FIG. 1, the anchor holes 14 are through holes, and the mold cells 18 are also through holes. Accordingly, a suitable backing plate 20 is disposed in abutting contact with one side of the strip 12 to seal the anchor holes 14 thereby. A suitable injection head 22 is disposed in abutting contact with one side of the mold 16 to seal the mold cells 18 thereby, with the strip 12 and mold 16 being sandwiched between the backing plate 20 and the injection head 22. Disposed in the injection head 22 is an injection port 22a and a vacuum port 22b spaced laterally therefrom with a shallow cross channel 22c extending therebetween to prevent solder flow from the injection port 22a to the vacuum port 22b.

Conventional means 24 are provided for supplying melted solder 24a in liquid form into the solder injection port 22a for sequentially filling the anchor holes 14 and mold cells 18 therewith in pairs as the injection head 22 is suitably translated laterally across the mold 16 as shown in the first step (a). In this way, the anchor holes 14 and mold cells 18 are filled with the liquid solder 24a which is then allowed to cool therein to solidify the solder 24a to form solidified solder bumps or beads 26 shown in step (b). In step (c), the mold 16 is suitably lifted or separated from the decal strip 12 to form the resulting solder decal 10 containing the solid solder beads 26 mechanically joined thereto by respective integral solidified solder stems 26b formed in respective ones of the anchor holes 14. In the exemplary embodiment illustrated in FIG. 1, each of the mold cells 18 corresponds with or is aligned with a single one of the anchor holes 14 to form the solder beads 26 with a respective single one of the stems 26b.

In accordance with the present invention, the decal strip 12 and the mold 16, along with the backing plate 20 and injection head 22 are formed of a suitable material which does not metallurgically or chemically bond with the solder 24a so that the solder beads 26 are solely mechanically joined to the strip 12 and may be simply removable therefrom by reflowing or reliquifying the solder 24a by suitable heating thereof. In order to create a suitable mechanical joint between the stems 26b and the anchor holes 14, the stems 26b are preferably reentrant in cross section, or conically divergent away from the solder beads 26 with the corresponding anchor holes 14 being complementary in shape to prevent withdrawal of the stems 26b from the anchor holes 14. The solder bead 26 is suitably larger than its corresponding stem 26b to prevent liberation of the solder bead 26 in one direction through the anchor holes 14, with the reentrant shape of the stem 26b preventing liberation of the solder bead 26 in the opposite direction through the anchor hole 14.

Since in the preferred embodiment illustrated in FIG. 1, it is desired to remove the mold 16 from the solder beads 26, the solder beads 26 preferably converge outwardly away from the strip 12 in the exemplary frustoconical or truncated cone shape illustrated. The mold cells 18 have corresponding frustoconical shapes in this exemplary embodiment. Since the mold 16 does not bond to the solder beads 26 on solidification of the solder 24a, the converging shape of the solder beads 26 allows ready removal of the mold 16 therefrom as illustrated in step (c).

In the exemplary embodiment illustrated in FIG. 1, both the anchor holes 14 and the mold cells 18 are through holes which are preferably closed at one end thereof by the backing plate 20 to prevent solder flow therethrough. The injection head 22 is disposed on the opposite side thereof for injecting the solder 24a therein. In order to fully fill the respective anchor holes 14 and mold cells 18 with the liquid solder 24a, a suitable vacuum pump 28 is disposed in flow communication with the vacuum port 22b for evacuating each of the anchor hole 14 and mold cell 18 pairs to effect a suitable vacuum therein prior to injecting the liquid solder 24a therein. As the injection head 22 is traversed from cell to cell as illustrated in step (a) of FIG. 1A, each of the cells 18 is evacuated and then injected with the liquid solder 24a from the injection port 22a. In this way, the cell/anchor hole pairs are sequentially evacuated and filled with solder to create the solder beads 26. Further details of the injection head 22 are not part of the present invention but may be found in the cross-referenced application.

Figure 2:
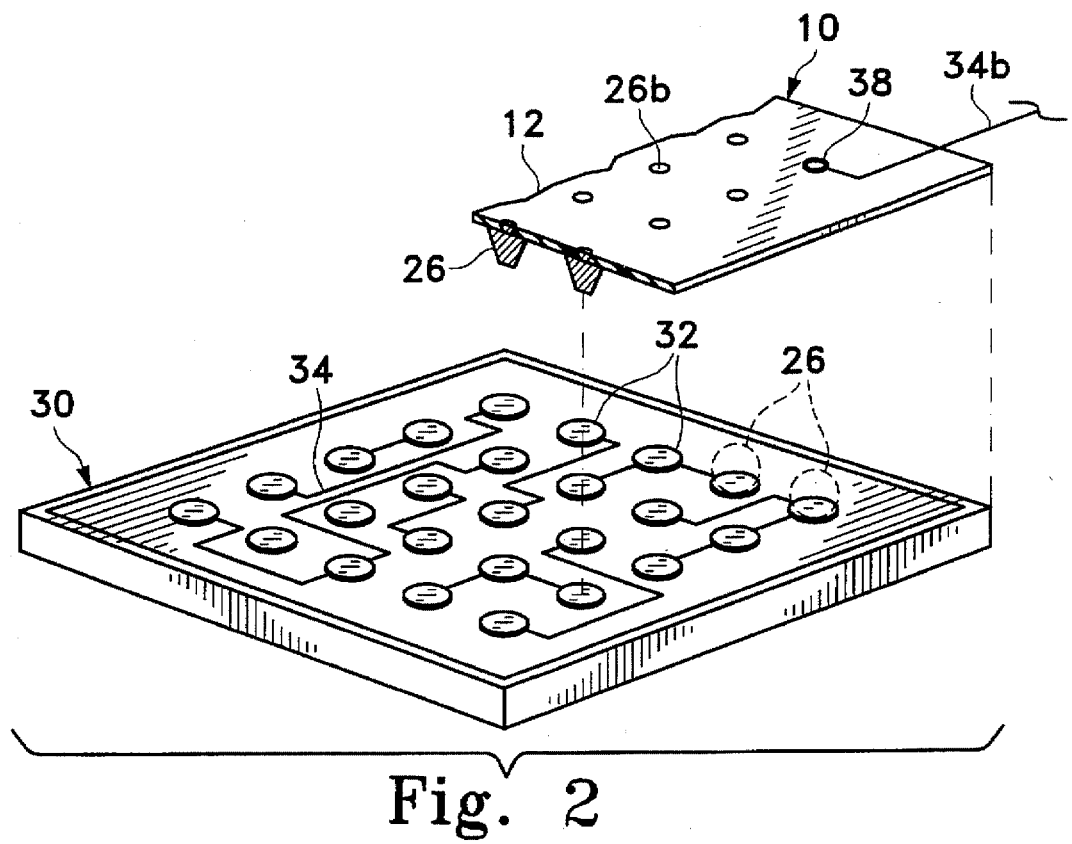
FIG. 2 is an isometric view of an exemplary circuit chip or substrate having pads to which may be transferred the solder beads from the solder decal produced in FIG. 1.

A portion of the resulting solder decal 10 is illustrated in FIG. 2 adjacent to an exemplary electrically active first substrate 30 which may take any suitable form including an integrated circuit chip formed in silicon. The substrate 30 includes a plurality of electrically conductive first pads 32 with suitable electrical lines 34 interconnecting the pads as desired. As described in further detail hereinbelow, the solder decal 10 is aligned with the substrate 30 so that the solder beads 26 abut respective ones of the pads 32 so that the beads 26 may be heated to reflow or reliquify the solder therein and wet the solder to the pads 32 for metallurgically bonding thereto.

Figure 3:
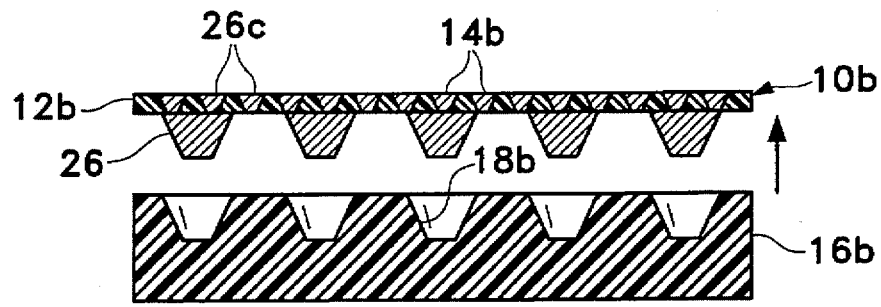
FIG. 3 is a sectional view of a solder decal in accordance with another embodiment of the present invention having a flexible decal supporting a plurality of solder beads by a respective plurality of stems.
Figure 4:
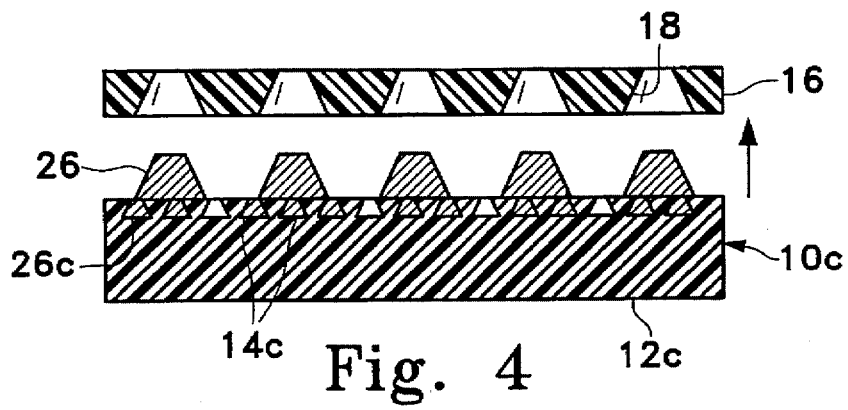
FIG. 4 is a sectional view of a solder decal in accordance with another embodiment of the present invention having a rigid decal supporting a plurality of solder beads by a respective plurality of stems.

As indicated above with respect to FIG. 1, each solder bead 26 may have an integral single stem 26b. FIGS. 3 and 4 illustrate alternate embodiments of solder decals 10b and 10c wherein each of the mold cells 18,18b is aligned with a plurality of suitably smaller anchor holes 14b,c to form the solder beads 26 with respective pluralities of stems 26c. In this way, the actual alignment of the anchor holes 14b,c with the mold cells 18,18b is of less concern since each solder bead 26 will have multiple stems 26c. In the FIG. 3 embodiment, the mold 16b includes blind mold cells 18b extending partly therein, with the anchor holes 14b extending through the decal strip 12b. In the FIG. 4 embodiment, the anchor holes 14c are blind holes extending in part into the decal strip 12c, and the mold cells 18 extend through the mold 16 as in the FIG. 1 embodiment. In FIG. 3, the liquid solder is injected through the anchor holes 14b into the mold cells 18b, and in FIG. 4, the liquid solder is injected through the mold cells 18 and into the anchor holes 14c.

Figure 5:
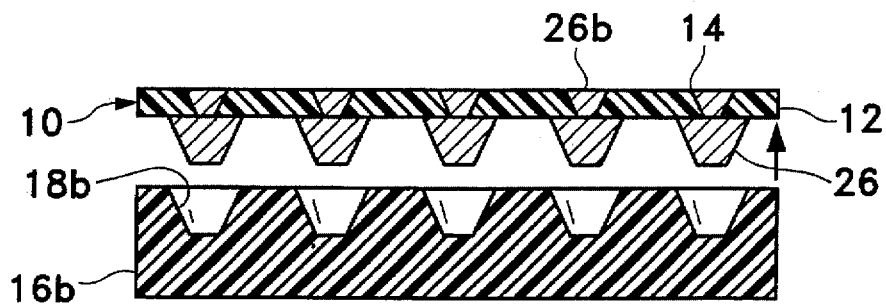
FIG. 5 is a sectional view of a solder decal in accordance with another embodiment of the present invention having a flexible strip supporting a plurality of solder beads thereon formed from a mold having blind cells.

In the FIG. 5 embodiment, the anchor holes 14 extend completely through the decal strip 12, with the liquid solder 24a being injected through the anchor holes 14 and into the mold cells 18b. The decal strip 12 is preferably thin and flexible to form a flexible decal 10 identical to the decal 10 illustrated in FIG. 1.

Figure 6:
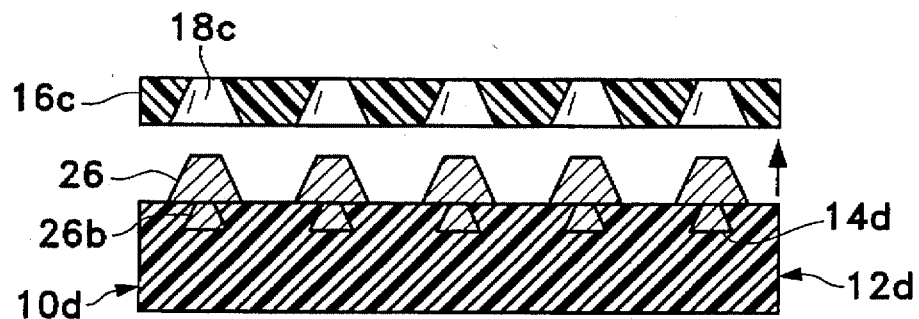
FIG. 6 is a sectional view of a solder decal in accordance with another embodiment of the present invention having a rigid strip supporting a plurality of solder beads formed from a mold having through cells.

In FIG. 6, the anchor holes 14d are blind holes extending partly into the decal strip 12d only in part and are not through holes.

Correspondingly, the mold cells 18b illustrated in FIG. 5 are blind holes extending into the mold 16b only in part and are not through holes. Whereas the mold cells 18c illustrated in FIG. 6 extend completely through the mold 16c as in the FIG. 1 embodiment.

In the embodiments illustrated in FIGS. 1–3 and 5, the decal strips 12 and 12b are transversely flexible for readily bending to form corresponding flexible decals 10 and 10b. The corresponding molds 16 and 16b are preferably rigid.

In the FIG. 6 embodiment, the mold 16c having cells 18c is preferably flexible, with the decal strip 12d being rigid to form a rigid decal 10d.

In the above embodiments, either the mold or the decal strip is flexible to facilitate separation of the molds from the decal strips after solidification of the solder. Suitable rigid materials may include metal, glass, silicon, and polymers and other materials capable of withstanding solder processing temperatures. Flexible materials include for example polymers and thin metals. Suitably thick polyimides, such as that known under the trademark Kapton commercially available from the Dupont Company, may be used to provide flexibility or rigidity for either or both of the decal strips and molds. These materials also do not metallurgically bond to typical solders as desired in the present invention.

In one embodiment, a flexible decal strip may be formed of about 1 to 2 mils. thick Kapton, with the tapered anchor holes 14 such as those illustrated in FIG. 1 being conventionally formed using laser photo-ablation which typically produces a 60° taper. The mold 16 may be a thicker Kapton layer of about 3 to about 5 mils and the same laser photo-ablation process may be used to form 60° taper mold cells 18 therein. Any suitable processing method may be used to produce the various anchor holes 14 and mold cells 18 in various sizes including etching, photo-ablation, or punching which are typically used for relatively small features. For larger features, drilling with tapered bits may also be used. Furthermore, anisotropic etching in 1-1-0 silicon will produce a blind inwardly expanding or locking tapered hole. Isotropic etching in 1-0-0 silicon will produce a blind outwardly expanding or non-locking tapered hole. Furthermore, through holes may also be made in the silicon depending upon the thickness thereof and etching time if desired.

Figure 7:
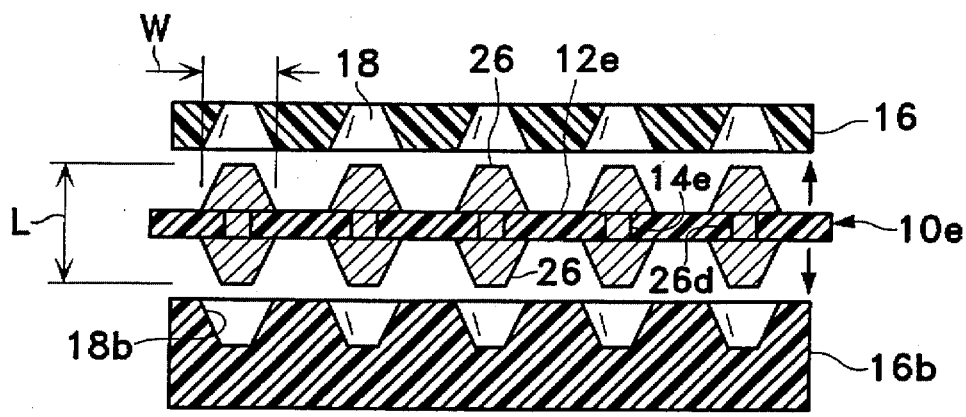
FIG. 7 is a sectional view of a solder decal in accordance with another embodiment of the present invention having two-sided solder beads extending therefrom.

FIG. 7 illustrates yet another embodiment of a two-sided solder decal 10e which includes a pair of molds 16,16b on opposite sides of the decal strip 12e initially in abutting contact therewith. The mold cells 18 in the upper mold 16 are through holes, whereas the mold cells 18b in the lower mold 16b are blind holes. The injection head 22 illustrated in FIG. 1 is suitably traversed over the top of the upper mold 16 for injecting the liquid solder into both molds 16, 16b and through anchor holes 14e to form the decal 10e with solder beads 26 on opposite sides thereof. In this embodiment, a common solder stem 26d joins respective opposite ones of the solder beads 26 in pairs. The stems 26d may be simply cylindrical in configuration and formed by complementary cylindrical anchor holes 14e. Since the solder beads 26 are formed on both sides of the decal strip 12e they collectively have a length L and a common width W for providing a relatively large length to width (L/W) ratio for accommodating thermal mismatch when used in electrically joining together opposing components as discussed in more detail hereinbelow. In this embodiment the decal strip 12e is preferably flexible.

Figure 8:
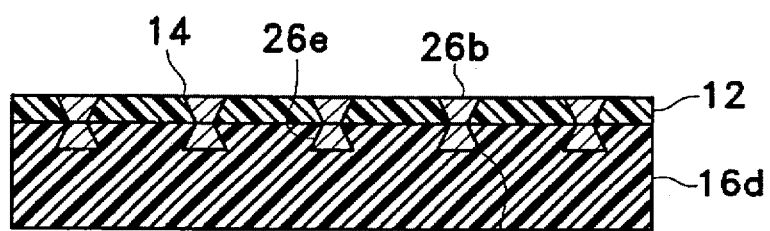
FIG. 8 is a sectional view of a solder decal in accordance with another embodiment of the present invention wherein the decal strip is mechanically joined to the mold by solder bead stems.

FIG. 8 illustrates another embodiment of the invention wherein an hourglass shape locking hole may be produced in a composite material assembly of laminations, with the hole being filled with solder for securing together the separate components. In this embodiment, the mold 16d includes a plurality of blind reentrant mold cells 18d extending partly therein, with the decal strip 12 similarly including reentrant anchor holes 14 which extend completely therethrough. The anchor holes 14 and the mold cells 18d are aligned with each other to collectively form the hourglass shape. Each of the mold cells 18d is conically divergent away from the anchor holes 14, and each of the anchor holes 14 is similarly conically divergent away from the mold cells 18d so that the solidified solder therein forms mirror stems 26b and 26e that mechanically join the decal strip 12 to the mold 16d to prevent mechanical disassembly thereof. In one exemplary embodiment, the mold 16d may comprise a glass substrate coated with a thin metal or polymer layer forming the decal strip 12. Holes are first etched or ablated in the top layer to form the anchor holes 14. Thereafter, a glass etchant produces holes in the glass of the mold 16d to produce the mold cells 18d that have an isotropic etch profile. Etching proceeds in the glass mold 16d until these holes undercut the holes in the top layer. These undercut holes define the reentrant mold cell 18d that provides the locking feature upon being filled with solder.

The above embodiments are merely representative of the various combinations that may be created using two or more layers of decal strips and molds with solder injection to form the various mechanically locked solder beads. These exemplary embodiments may be used in various applications for providing significant improvements over conventional processes known in the art.

Figure 9A:
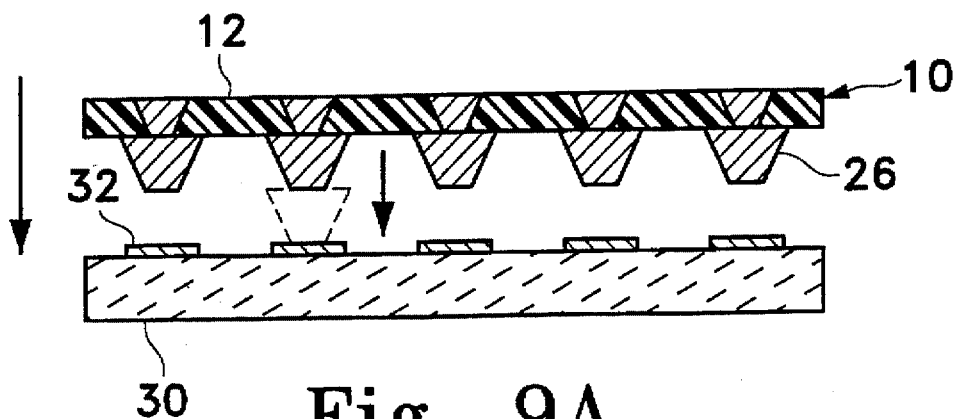
FIGS. 9A–9C are a schematic representation in section of transferring solder beads from an exemplary solder decal to an integrated circuit chip or substrate.
Figure 9B:
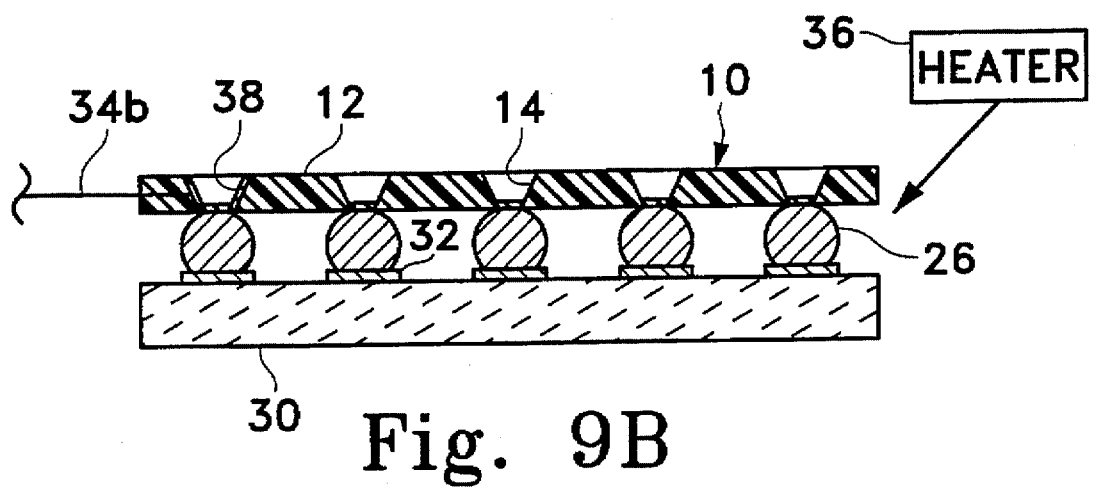
Figure 9C:
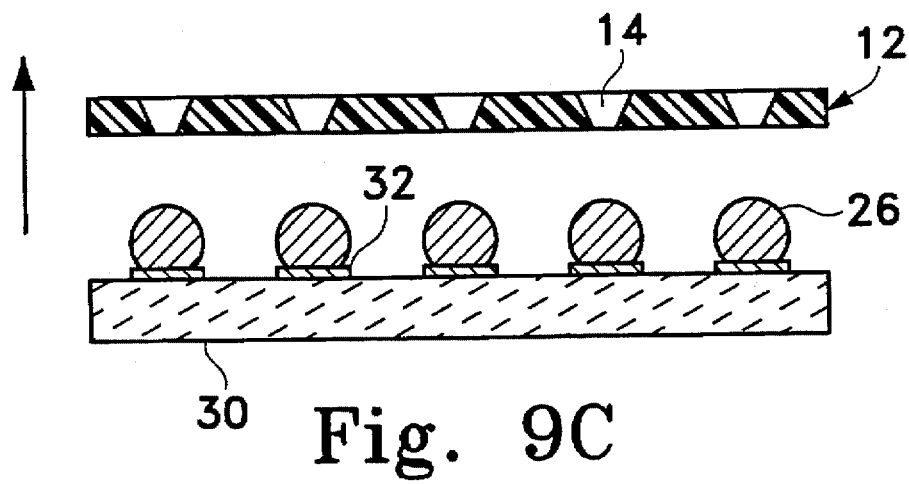

For example, FIGS. 9A-9C (referred to collectively as FIG. 9) illustrate three basic steps (a), (b), and (c), respectively, of transferring the solidified solder beads 26 from the decal 10 to the corresponding first pads 32 of the first substrate 30 initially shown in FIG. 2. In step (a), the solder decal 10 is aligned with the first substrate 30 having the first pads 32 thereon, with a respective one of the solder beads 26 abutting a respective one of the pads 32. A suitable heater 36 is then used in step (b) for heating the solder beads 26 to reflow or reliquify the solder beads 26 and wet the solder to the pads 32. This is preferably accomplished using a suitable solder flux or in a suitable reducing atmosphere so that the solder within the anchor holes 14 is pulled out therefrom due to surface tension. In step (c) the decal strip 12 is lifted or separated away from the substrate 30 while the solder is still liquid to transfer the liquid solder to the pads 32, followed in turn by cooling the solder on the pads 32 to metallurgically bond the solder thereto. Since the solder has no metallurgical affinity to the decal strip 12 substantially all of the solder will be transferred to the respective pads 32 to form solidified beads 26 thereon. The empty decal 12 may then be reused by again forming solder beads 26 thereon as described above, with the process being repeated as many times as desired.

In an alternate embodiment also shown in step (b) of FIG. 9B, one or more of the anchor holes 14 may include an electrically conductive metallized layer 38 joined by suitable electrical lines 34b for producing an inexpensive flexible circuit or connector. In this embodiment, step (c) is not accomplished but instead the decal strip 12 is maintained closely adjacent to the substrate 30 as shown in step (b) so that the reflow solder maintains contact with the metallized anchor holes 14 in addition to the pads 32. The solder is then allowed to cool and solidify for forming an electrical junction between the anchor holes 14 and the pads 32. In this way, the substrate 30 is electrically connected through the decal strip 12 itself at the respective metallized anchor holes 14.

FIGS. 10A-10F (referred to collectively as FIG. 10) illustrate another application using steps (a) through (f), respectively, for producing a solder decal 10f which may be used for burn-in and testing as well as solder transfer. This application has substantial cost-saving and process simplification potential by combining many previously separate processing steps. In this embodiment, step (a) begins with a decal strip 12f in the form of a second electrically active substrate which includes a plurality of second electrically conductive pads 32b disposed in respective ones of blind reentrant anchor holes 14f. Suitable electrically conductive lines 34c extend through the strip 12f to join first ends thereof to the second pads 32b, and join opposite ends to a respective plurality of lead pins 40 which extend outwardly from the strip 12f for effecting electrical communication in conventional fashion. The mold 16c with its cells 18c is suitably aligned atop the decal strip 12f, with the solder injection head 22 then being positioned atop the mold 16c for forming the solder beads 26 as described above. In step (b), the mold 16c is removed to expose the solidified solder beads 26.

In step (c), the first substrate 30 is in the form of a conventional integrated circuit chip or board which is aligned with the solder beads 26 for joining in abutting contact respective pairs of the pads 32 and the beads 26. The heater 36 then heats the solder beads 26 in the presence of a suitable flux to reflow or reliquify the solder beads 26 which are then allowed to cool for electrically joining the first substrate 30 to the substrate or strip 12f between the respective first and second pads 32 and 32b thereof as shown in step (d). The first substrate or strip 30 now electrically connected to the substrate strip 12f through the solidified beads 26 may then be conventionally burned-in and tested using a conventional test circuit 42 specifically configured therefor and joined to the pins 40.

After burn-in testing, the heater 36 is used for reheating the solder beads 26 to reflow or reliquify the solder, and then the first substrate 30 or chip is lifted for separating it away from the decal strip 12f as shown in step (e) while the solder is still liquid to transfer the liquid solder to the first pads 32. Surface tension separates the liquid solder from the strip 12f so that a majority of each solder bead 26 transfers to the first pads 32, with only a small amount of the solder being retained by the second pads 32b inside the anchor holes 14f. The solder transfer is enhanced since each of the first pads 32 has a substantially greater surface area than that of the necked-in top portion of the reentrant anchor holes 14f. Thus in substantially one solder processing step, burn-in, test, and solder transfer to the chip or substrate 30 may be accomplished. The resulting substantially empty decal strip 12f is illustrated in step (f) along with the mold 16c which may then be used to repeat the process as shown in step (a).

Figure 11:
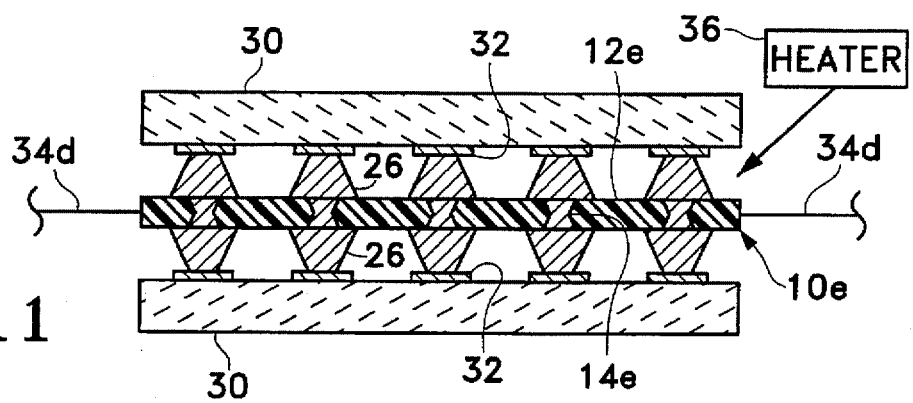
FIG. 11 is a sectional view of a two-sided solder decal in accordance with another embodiment of the invention disposed in contact with a pair of adjacent chips or substrates for accommodating thermal mismatch therebetween.

The two-sided solder decal 10e illustrated in FIG. 7 is shown in an exemplary application in FIG. 11 for improving testing, accommodating differential thermal movement between a pair of opposing ones of the first substrates 30, and for 3-D packaging. In the first application, the solder decal 10e is aligned between the pair of substrates 30 which may be suitably held in contact therewith for establishing temporary connections for test applications wherein the decal 10e functions as an interposer. Interposers are conventionally known for joining a testing circuit to a functional circuit to be tested.

In the second application, the solder decal 10e is aligned between the pair of substrates prior to heating the solder beads 26 using the heater 36 and prior to cooling of the reflow solder beads 26 for bonding the opposite solder beads 26 to respective pads 32 on the opposite substrates 30. In this way, the relatively high L/W ratio of the opposing solder beads 26 may be used to allow relative lateral movement between the opposing substrates 30 due to differential thermal expansion and contraction thereof, while still maintaining an electrical path through each of the solder bead pairs 26 and the opposing pads 32 bonded thereto. In the exemplary embodiment illustrated in FIG. 11, the L/W ratio of the opposing solder beads 26 is greater than about 2/1. In order to maintain the relatively tall solder beads 26 upon attachment to the respective pads 32 of the opposing substrates 30, it is desirable to reflow solely the tips of the beads 26 for metallurgically bonding the beads 26 to the pads 32. Or, the pads 32 themselves may contain a lower temperature solder than that of the solder beads 26, with the heater 36 being used for melting solely the lower temperature solder on the pads 32 without melting the beads 26 to effect the solder joints therebetween.

If desired in the third application, the decal strip 12e illustrated in FIG. 11 may be an electrically active carrier wherein the anchor holes 14e are metallized (layer 38) as was done in the anchor holes illustrated in step (b) of FIG. 9, with suitable electrical lines 34d being joined thereto. In this way, the opposite substrates 30 may be independently electrically joined to an external source as desired via the electrical lines 34d and the solder beads 26 joined thereto by the metallized anchor holes 14e.

Figure 12A:
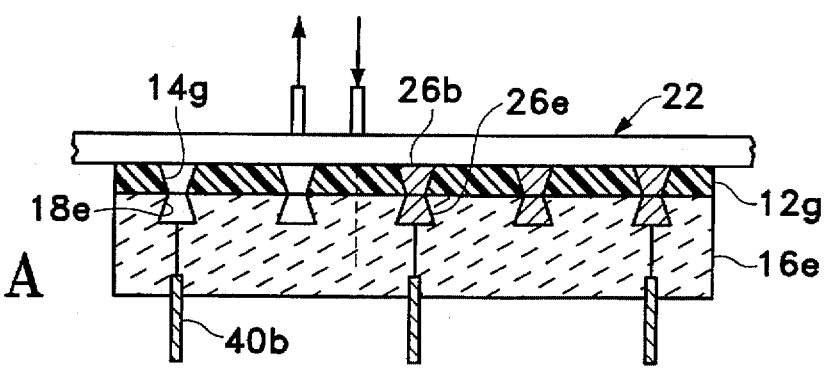
FIGS. 12A–12C are a schematic representation in section of a solder decal in accordance with another embodiment of the present invention in which the decal strip forms a signal circuit mechanically joined to a power substrate by solder bead stems, with the strip being in turn joined to an integrated circuit chip or substrate by additional solder beads.
Figure 12B:
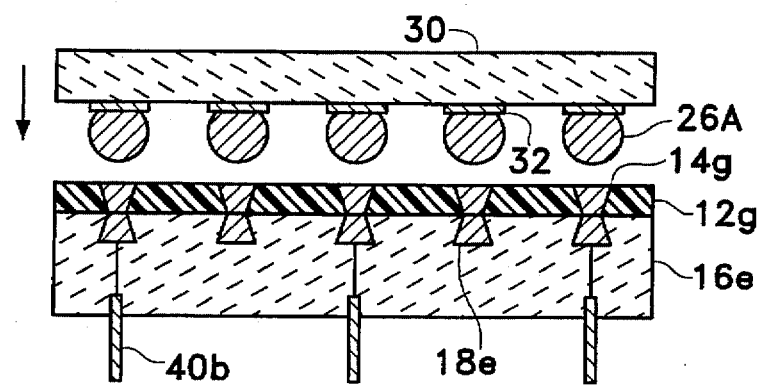
Figure 12C:
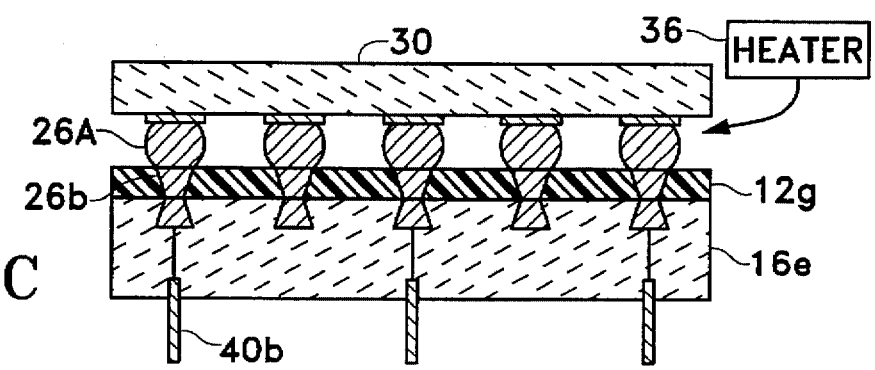

FIGS. 12A-12C (referred to collectively as FIG. 12) illustrate yet another application of the present invention in three basic steps (a), (b), and (c), respectively. In this application, the mold 16e is in the form of an electrically active substrate or power circuit, with the mold cells 18e and the anchor holes 14g of the decal strip 12g being suitably metallized for being electrically conductive. The mold cells 18e are suitably electrically joined to respective power pins 40b extending outwardly from the mold 16e. As shown in step (a), the solder injection head 22 is mounted atop the decal strip 12g to sequentially fill the corresponding anchor holes 14g and mold cells 18e to form first solder beads with the reentrant, hourglass shape stems 26b and 26e as was done in the FIG. 8 embodiment. The head 22 is removed, and a first substrate 30 having a plurality of electrically conducting first pads 32 is aligned with the decal strip 12g as illustrated in step (b). The pads 32 contain previously transferred second solder beads 26A thereon, as produced for example in the FIG. 9 process, with the second beads 26A being disposed in abutting contact with the stems 26b of the first beads as illustrated in step (c). The heater 36 is then used to reflow or reliquify the second solder beads 26A which then metallurgically bond to the stems 26b of the first solder beads. In this way, the first substrate 30 is electrically joined to both the decal strip 12g and the mold substrate 16e.

In this embodiment, the decal strip substrate 12g comprises a low power and low current communication signal circuit, whereas the mold substrate 16e comprises a high power substrate or circuit. The power pins 40b are electrically joined to the power circuit or mold 16e and to the first substrate 30 for providing power or electrical current thereto. The signal circuit or strip 12g is electrically connected to the power circuit or mold 16e and the first substrate 30 through respective pairs of the metallized anchor holes 14g and mold cells 18e. In this way, the respective pairs or anchor holes 14g and mold cells 18e which are filled with solder provide electrical paths from the power substrate 16e to the decal substrate 12g and in turn to the first substrate 30. And, the signal path to the decal substrate 12g may be electrically separated from the power substrate 16e. The solder injected into the anchor holes 14g and the mold cells 18e is preferably a eutectic Pb/Sn alloy, which has a lower reflow temperature than the typical 95 Pb/5 Sn alloy found on chips which comprises the second solder beads 26A. The top substrate 30 with the higher temperature alloy may be joined to the composite signal substrate 12g and power substrate 16e by reflowing the eutectic solder only. This produces a complete circuit package in a convenient manner.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims:

I claim:

1. A method of effecting a solder decal comprising:
   aligning in abutting contact a decal strip having a plurality of anchor holes with a mold having a plurality of cells;
   injecting into said anchor holes and said mold cells liquid solder to fill respective pairs thereof; and cooling said liquid solder in said holes and cells to solidify said solder therein.

2. A method according to claim 1 further comprising separating said mold from said decal strip to form said solder decal containing solder beads each having a stem mechanically joined to said strip at respective ones of said anchor holes.

3. A method according to claim 2 wherein said anchor hole and mold cell pairs are closed at one end to prevent solder flow therethrough, and said method further comprises evacuating each of said anchor hole and mold cell pairs prior to injecting said liquid solder therein.

4. A method according to claim 2 wherein said decal strip and said mold comprise material not bondable with said solder so that said solder beads are solely mechanically joined to said strip and are removable therefrom by reliquifying said solder.

5. A method according to claim 4 wherein each of said mold cells is aligned with a single one of said anchor holes to form said solder beads with a respective single one of said stems.

6. A method according to claim 4 wherein each of said mold cells is aligned with a plurality of said anchor holes to form said solder beads with a respective plurality of said stems.

7. A method according to claim 4 wherein said anchor holes extend through said decal strip.

8. A method according to claim 4 wherein said anchor holes are blind holes extending into said decal strip only in part.

9. A method according to claim 4 wherein said mold cells extend through said mold.

10. A method according to claim 4 wherein said mold cells are blind holes extending into said mold only in part.

11. A method according to claim 4 wherein said mold is rigid and said decal strip is flexible to form a flexible decal.

12. A method according to claim 4 wherein said mold is flexible and said decal strip is rigid to form a rigid decal.

13. A method according to claim 4 further comprising aligning a pair of said molds on opposite sides of said decal strip and injecting said liquid solder into both said molds and said anchor holes to form said decal with said solder beads on opposite sides thereof.

14. A method according to claim 2 further comprising:
aligning said solder decal with a first substrate having a plurality of electrically conductive first pads, with said solder beads abutting respective ones of said pads;
heating said solder beads to reflow said solder and wet said solder to said pads; and
cooling said solder on said pads to metallurgically bond said solder thereto.

15. A method according to claim 14 further comprising separating said decal strip away from said first substrate while said solder is liquid to transfer said liquid solder to said pads prior to cooling said solder on said first pads.

16. A method according to claim 14 further comprising:
aligning a pair of said molds on opposite sides of said decal strip and injecting said liquid solder in both said molds and said anchor holes to form said decal with solder beads on opposite sides thereof; and
aligning said solder decal between a pair of opposing ones of said first substrate prior to said heating and cooling steps for bonding said opposite solder beads to respective pads on said opposite substrates.

17. A method according to claim 16 wherein said anchor holes are electrically conductive, and said decal strip has electrically conductive lines extending to said anchor holes.

18. A method according to claim 13 further comprising aligning said solder decal between a pair of opposing ones of said first substrate to form temporary abutting connections therewith.

19. A method according to claim 2 wherein each of said anchor holes is conically divergent away from said mold cells so that said solidified solder therein mechanically joins said decal strip to said mold to prevent mechanical disassembly thereof.

20. A method according to claim 19 wherein each of said solder beads has a single one of said stems.

21. A method according to claim 19 wherein each of said solder beads has a plurality of said stems.

22. A method according to claim 19 wherein said anchor holes extend through said decals.

23. A method according to claim 19 wherein said anchor holes are blind holes extending into said decal strip only in part.

24. A method according to claim 19 wherein said decal strip is flexible to form a flexible decal.

25. A method according to claim 19 wherein said decal strip is rigid to form a rigid decal.

26. A method according to claim 13 further comprising a common single one of said anchor holes extending between respective opposite pairs of said mold cells.

27. A method of effecting a solder decal comprising:
aligning in abutting contact a decal strip having a plurality of anchor holes with a mold having a plurality of cells;
injecting into said anchor holes and said mold cells liquid solder to fill respective pairs thereof; and
cooling said liquid solder in said holes and cells to solidify said solder therein; and
wherein each of said mold cells is conically divergent away from said anchor holes, and each of said anchor holes is conically divergent away from said mold cells so that said solidified solder therein mechanically joins said decal strip to said mold to prevent mechanical disassembly thereof.

28. A method according to claim 27 wherein said mold is in the form of a substrate, said mold cells and said anchor holes are electrically conductive, with said mold cells being electrically joined to respective power pins extending from said mold and further comprising:
aligning said solder decal with a first substrate having a plurality of electrically conductive first pads and solder beads thereon;
heating said solder beads to reflow said solder and wet said solder to said solder in said anchor holes; and
cooling said solder beads to metallurgically bond said solder beads to said solder in said anchor holes.

29. A method according to claim 28 wherein:
said decal strip comprises a communication signal circuit;
said mold comprises a power circuit; and
said power pins are electrically joined to said power circuit and said first substrate for providing power thereto, and said signal circuit is electrically connected to said power circuit and said first substrate through respective pairs of said anchor holes and mold cells.

30. A method of effecting a solder decal comprising:
aligning in abutting contact a decal strip having a plurality of anchor holes with a mold having a plurality of cells;
injecting into said anchor holes and said mold cells liquid solder to fill respective pairs thereof;
cooling said liquid solder in said holes and cells to solidify said solder therein;

separating said mold from said decal strip to form said solder decal containing solder beads each having a stem mechanically joined to said strip at respective ones of said anchor holes;

aligning said solder decal with a first substrate having a plurality of electrically conductive first pads, with said solder beads abutting respective ones of said pads;

heating said solder beads to reflow said solder and wet said solder to said pads; and cooling said solder on said pads to metallurgically bond said solder thereto; and wherein said anchor holes are electrically conductive, and said decal strip has electrically conductive lines extending to said anchor holes; and said decal strip is maintained adjacent to said first substrate so that solidification of said solder electrically joins said anchor holes to respective ones of said pads.

31. A method according to claim 30 wherein:

said decal strip is in the form of a second substrate and further includes a plurality of second electrically conductive pads disposed in respective ones of said anchor holes, and said conductive lines extend to said second pads from one end and to a respective plurality of lead pins from an opposite end, said pins extending outwardly from said second substrate for effecting electrical communication; and said first substrate comprises an integrated circuit chip electrically joined to said second substrate upon solidification of said solder between said first and second pads; and said method further comprises:

electrically testing said integrated circuit chip through said pins of said second substrate.

32. A method according to claim 31 further comprising:

reheating said solder beads to reflow said solder; and separating said integrated circuit chip away from said decal strip while said solder is liquid to transfer said liquid solder to said first pads.

* * * * *